United States Patent [19]
Sawada et al.

[11] Patent Number: 5,412,601
[45] Date of Patent: May 2, 1995

[54] NON-VOLATILE SEMICONDUCTOR MEMORY DEVICE CAPABLE OF STORING MULTI-VALUE DATA IN EACH MEMORY CELL

[75] Inventors: Kikuzo Sawada; Toshio Wada, both of Tokyo, Japan

[73] Assignee: Nippon Steel Corporation, Tokyo, Japan

[21] Appl. No.: 112,997

[22] Filed: Aug. 30, 1993

[30] Foreign Application Priority Data

| | | | |
|---|---|---|---|
| Aug. 31, 1992 | [JP] | Japan | 4-255608 |
| Aug. 31, 1992 | [JP] | Japan | 4-255609 |
| Aug. 31, 1992 | [JP] | Japan | 4-255610 |

[51] Int. Cl.$^6$ ............................................. G11C 11/56
[52] U.S. Cl. ................................... 365/185; 365/184; 365/189.01; 365/168
[58] Field of Search .................... 365/168, 184, 189.01, 365/185, 104

[56] References Cited

U.S. PATENT DOCUMENTS

| | | | |
|---|---|---|---|
| 4,809,224 | 2/1989 | Suzuki et al. | 365/168 |
| 5,012,448 | 4/1991 | Matsuoka et al. | 365/168 |
| 5,043,940 | 8/1991 | Harari | 365/168 |
| 5,119,330 | 6/1992 | Tanagawa | 365/185 |

FOREIGN PATENT DOCUMENTS

3-237692 10/1991 Japan.

OTHER PUBLICATIONS

A 16 kb Electrically Eraseable Volatile Memory 1980 IEEE ISSCC Dig. Tech. Pap., pp. 152-153, 271, 1980.
Analysis and Modeling of Floating-Gate EPROM Cells IEEE Trans. Electron Devices 1986, Jun., ED-33, No. 6, pp. 835-844.
Semiconductor MOS Memory and Method of Using the Same, Nikken Kogyo Newspaper Co. 1990, pp. 96-101.

*Primary Examiner*—Joseph A. Popek
*Assistant Examiner*—Vu Le
*Attorney, Agent, or Firm*—Pollock, Vande Sande & Priddy

[57] ABSTRACT

An electrically erasable non-volatile semiconductor memory device comprising a plurality of row lines and column lines, a plurality of memory cells connected in a matrix to the plurality of row lines and column lines, a selection circuit for selecting a desired one of the plurality of memory cells, and write-control circuit for writing data into the plurality of memory cells. The write-control circuit is adapted to preset at least four voltage signals having different voltage values, and to select one of four voltage signals according to a data signal externally applied thereto and applying the selected voltage signal to the selected memory cell. Also included is read-control circuit for reading out data written into the selected memory cell and converting the data read-out from the selected memory cell into a data signal corresponding to one of the four voltage signals.

21 Claims, 9 Drawing Sheets

NON-VOLATILE SEMICONDUCTOR MEMORY DEVICE CAPABLE OF STORING MULTI-VALUE DATA IN EACH MEMORY CELL

BACKGROUND OF THE INVENTION

FIELD OF THE INVENTION

This invention relates to a non-volatile semiconductor memory device.

Document 1: A 16 Kb Electrically Erasable Nonvolatile Memory, 1980, IEEEE, ISSCC, Dig. Tech. Pap., pp 152–153, 271, 1980.

Document 2: Analysis and Modeling of Floating-Gate EEPROM Cells, IEEE Trans., Electron Devices, 1986, June, ED-33, No. 6, pp 835–844.

Document 3: Semiconductor MOS Memory and Method of Using the Same, Nikkan Kogyo Newspaper Co., 1990, pp 96–101.

A non-volatile semiconductor memory device in which the recorded data is not lost even if the power supply is turned off (hereinafter, referred to as PROM) has already been developed and practically used since the early 1970's. In addition, another non-volatile semiconductor memory device which is electrically erasable (hereinafter, referred to as EEPROM) as described in the document 1 has been practically used since the 1980's. In the write operation of a memory cell of the EEPROM, as described in the documents 1 and 2, the transistor-structure memory cell having a floating gate is charged with electrons and discharged through a thin insulating oxide film by means of the Fowler-Nordheim tunneling phenomenon, so that the threshold voltage of the transistor can be controlled. The threshold value of the memory cell is increased by injecting electrons into the floating gate and decreased by discharging electrons and injecting holes.

FIG. 9 is a circuit block diagram of the conventional EEPROM. In FIG. 9, there are shown 32 memory cells in 4 columns and 8 rows, in which two bits of data are simultaneously read and written for programming. In FIG. 9, there are also shown address input terminals 501, 502, 503 and 504 which are used for inputting the address data for the selected memory cells. Input terminals 505, 506 and 507 are used for inputting control signals for controlling the operation mode of the EEPROM; that is, the input terminal 505 is used for inputting a chip selection signal, the input terminal 506 for inputting an output selection signal, and the input terminal 507 for inputting a write signal. There are shown input/output terminals 508 and 509 from which the stored data of the selected memory cells in the read mode are produced, and to which the data to be stored in the memory cells in the write mode are supplied.

Address buffers 511, 512, 513 and 514 have the function to buffer and output the address data and the function to receive the power-down signal and reduce the consumption current in the input portion.

A chip control circuit 515 is responsive to the control signals at the input terminals 505, 506 and 507 to select the read mode, write mode, power-down mode (or standby mode) and output nonselection mode. The write mode is further divided into two different modes, or an erase mode and a program mode. In the erase mode, the byte or column line of the selected memory cell or memory cells of a memory block are made in the erased state in order for the memory cell or cells to be rewritten with other data to be stored. The erased state of the memory cell means that the threshold value of the memory cell is higher (or lower) than the gate voltage in the read operation. In the program mode, the selected memory cell is made in the programmed state in accordance with the input data. The programmed state means that the threshold value of the memory cell is lower (or higher) than the gate voltage in the read operation. When the memory cell data is rewritten with other data, the erase mode is selected so that the memory cell is made in the erase state, and then made in the programmed state in accordance with the input data. In other words, the write mode includes the erase mode and the program mode. The chip control circuit additionally includes a function to automatically terminate the erase mode and the program mode by means of an internal timer.

A high-voltage generation/control circuit 518 has a circuit for increasing the source voltage supplied to the EEPROM in the write mode to generate a high voltage of about 10 through 25 V (hereinafter, referred to as the charge pump circuit), and a control circuit for supplying a desired high voltage to each circuit of the EEPROM in accordance with the erase mode and program mode. A column decoder 516 decodes the outputs from the address buffers 511 and 512, and applies a high (H) voltage only to the column line (also referred to as the word line) of the selected memory cell, and a low voltage to the column lines of the non-selected cells. A row decoder 517 decodes the outputs from the address buffers 513 and 514, and supplies a high-level signal to the row line of the selected memory cell and a low-level signal to the row lines of the non-selected memory cells through multiplexers 527 and 528. The multiplexers 527 and 528 connect the selected row line (also referred to as the bit line) to data lines 597 and 598 in accordance with the signals from the row decoder. The high level signal from the row decoder 517 is about the source voltage in the read mode and a high voltage in the write mode.

There are shown column lines 529, 530, 531 and 532, and row lines 533, 534, 535, 536, 537, 538, 539 and 540. There are also shown memory sense program lines 577, 578, 579 and 580, and memory cells 545, 546, . . . , 576. The structure and connection of the memory cells are the same as shown in FIGS. 1 and 3 in the document 1.

Data input buffers 520 and 524 buffer the input data from the input/output terminals 508 and 509 and supply the output data to program circuits 519 and 523 in the write mode. The program circuits 519 and 523 receive the signal and high voltage for the program mode, and output the high voltage or low voltage corresponding to the data input to the data lines 597 and 598.

Each of sense circuits 521, 525 detects and amplifies the magnitude of voltage or current values on the data line 597 or 598, to which the data of the memory cell selected in the read mode is transmitted through the row line 533, 534 . . . 540 and a multiplexer 527 or 528, to be outputted to the data output buffer 522, or 526. The data output buffers 522 and 526 supply the data from the sense circuits 521, 525 to the input/output terminals 508, 509 in the read mode. In addition, in the power-down mode and in the output non-selection mode, the data is inhibited from being produced.

Input signal lines 585 through 588 are connected to the multiplexers 527 and 528, respectively, to apply the control signals for switching the multiplexers thereto. The chip control circuit 515 supplies the power-down signal through a signal line 603 to the control input terminals of the address buffers 511, 512, 513 and 514, and supplies a read-enable signal through a signal line 589 to the sense circuits 521 and 525. In the program mode, the chip control circuit also supplies a program signal through a signal line 590 to the program circuits 519 and 523. The high voltage generation/control circuit 518 supplies high-voltage signals to the high-voltage lines 594 and 596, and supplies 0 volt to a memory sense line 595. An erase signal line 591 is connected to the high-voltage generation/control circuit 518, so that in the erase mode, the high-voltage output signal therefrom is supplied to the signal lines 594 and 595. A data input enable signal line 592 is connected to the data input buffers 520 and 524 so that in the write mode the data input buffers can be activated through the signal line. A data output enable signal line 593 is connected to the data output buffers 522 and 526 so that in the read mode the data output buffers can be activated through the signal line.

Circuits 541, 542, 543 and 544 decode the signal on the memory sense line 595 in accordance with the signals on the column lines 529, 530, 531 and 532, producing memory sense program signals 577, 578, 579 and 580, respectively. Shown at 604 is a memory ground line.

The write operation and read operation of the conventional EEPROM will be described briefly. In the read operation, the control signals from the input terminals 505, 506 and 507 are rendered to the read mode, and the selected address data are supplied to the address input terminals 501, 502, 503 and 504. The input address data are buffered by the buffers 511, 512, 513 and 514, and decoded by the column decoder 516 and row decoder 517. A selected one of the four output signal lines of the column decoder 516 is at a high voltage (normally about the source voltage), and the other signal lines are at a low voltage. The switching control signals 585 through 588 from the row decoder 517 are supplied to the multiplexer 527, selecting one of the row lines 533 . . . 536, and the selected row line is electrically connected to the data line 597 through a low impedance.

Similarly, the switching control signals 585 through 588 are supplied to the multiplexer 528, thereby selecting one of the row lines 537 through 540. At this time, a voltage of, for example, 2 through 4 V for detecting the threshold value of the memory cell is supplied on the memory sense line 595, and fed through the circuits 541 through 544 to only the selected one of the memory sense program lines 577, 578 . . . 580. The memory ground line 604 is in the grounded state. The row line of the selected memory cell is supplied with the threshold value detection voltage from the sense circuits 521 and 525. When the threshold voltage of the memory cell is lower than the threshold detection voltage, the selected memory cell transistor is turned on, and thus a current flows from the selected row line to the memory ground line 604. When the threshold voltage of the memory cell is higher than the threshold detection voltage, the selected memory cell transistor is turned off, and thus no current flows from the row line to the memory ground line 604. The voltage on the row line is set by the sense circuit 521 or 525, and the current to the row line in the read mode is supplied from the sense circuit 521 or 525. When this current is detected and amplified by the sense circuit, the stored data in the memory cell is produced in a binary value of a high or low voltage and fed through the data output buffer 522 or 526 to the outside. If the threshold value of the memory cell is as high as 6 V, a high voltage is produced at the input/output terminal 508. If the threshold value of the memory cell is as low as 0 V, a low voltage is produced at the input/output terminal 508.

In the write operation, the data in the memory cell is erased first. The data erasing is normally made for one column line at a time, but may be made for one byte or block. The erase mode is effected by the control input to the input terminals 505, 506, 507. In the erase mode, the column line of the memory cell is selected by the address data from the address input terminals 501, 502. A high-voltage signal is supplied to the column line of the selected memory cell, and 0 V is fed to the column lines of the other memory cells. In addition, the memory sense line 595 is at a high voltage, and the memory sense program line 577, 578 . . . 580 of the column line of the selected memory cell is at a high voltage by the circuits 541 through 544. The program circuits 519, 523 and the sense circuits 521, 525 are not activated in the erasing mode, and the data line 597 is at 0 V or in the floating state. The memory ground line 604 is grounded in the erasing mode. Thus, a high voltage (for example, 20 V) is applied to the gate of the memory cell of the selected column line, and the drain and source are grounded. At this time, the Fowler-Nordheim tunnel phenomenon occurs, causing electrons to be injected from the drain into the floating gate so that the threshold value of the memory cell transistor becomes high (for example, 5 through 8 V).

When the erased memory cell is rendered to the program state, the address data for program is supplied to the address input terminals 501, 502, 503, 505. In the program mode, the signal line 594 is supplied with a high voltage, the signal line 595 with 0 V, and the second high-voltage signal line 596 with a high voltage. The memory ground line 604 is rendered to the floating state. The column decoder 516, the row decoder 517, the program circuits 519, 523 and the data input buffers 520, 524 are activated, and the sense circuits 521, 525, and the data output buffers 522, 526 are deactivated. In other words, when a low voltage is supplied as input data to the input/output terminal 508, the program circuit 519 produces a high voltage (for example, 20 V) on the signal line 597, and when a high voltage is supplied to the input/output terminal 508, it produces 0 V on the signal line 597. When the signal line 597 is at a high voltage, a high-voltage signal is supplied to the selected one of the signal lines 585 through 588, and thus the selected row line is at a high voltage (for example, 20 V). The selected column line is also at a high voltage, and the memory sense program lines 577, 578 . . . 580 are at 0 V. Thus, the gate of the memory cell transistor is at 0 V, and the drain is at a high voltage (for example, 20 V). At this time, the Fowler-Nordheim tunneling is caused to discharge electrons from the floating gate to the drain, and inject holes from the drain into the floating gate, so that the threshold voltage of the memory cell transistor is reduced to, for example, $-3$ V to 0 V.

The circuit function of the conventional EEPROM has been described as above. The Fowler-Nordheim tunnel current on the storage principle is proportional to the electric field applied across the insulating film as expressed by the equation (1) in the document 2. The threshold value of the memory cell transistor is changed linearly with the high voltage in the erase or program mode as shown in FIGS. 6 and 9 in the document 2. In the conventional EEPROM, only a single high voltage value is used for each of the erase mode and program mode. Even in the read mode, only a binary value of a high or low value can be detected.

SUMMARY OF THE INVENTION

Accordingly, it is an object of the invention to provide a non-volatile semiconductor memory device capable of efficiently reading and writing data of four or more values from and into one memory cell.

According to this invention, to achieve the above object, there is provided an electrically erasable non-volatile memory device including a plurality of row lines and column lines, a plurality of memory cells connected in a matrix of rows and columns, selection means for selecting desired ones of the plurality of memory cells, write-control means for writing into a selected memory cell data corresponding to one of at least four different threshold values as selected according to data signal externally applied thereto and read-control means for converting data read from the memory cell is converted into data corresponding to the selected threshold value to be outputted.

In addition, in order to efficiently read and write data, the write-control means is connected to a data bus which is formed of a plurality of signal lines, and determines data to be written in the memory in accordance with a combination of signals supplied from at least two signal lines selected from the data bus.

Thus, data can be written in one memory cell by a single clock cycle by using the conventional memory data bus. In a memory structure having a wide data bus, it is possible to make a memory having 2 bits X m structure in which different data can be simultaneously written in a plurality of memory cells with a single address like a conventional memory of 1-bit X m structure.

In order to store data of four or more values in one memory cell, at least the following methods (a), (b) and (c) can be employed.
  (a) Signals of at least four different voltage values are generated, and one of the signals of at least four different voltage values is selected in accordance with a data signal supplied from the outside and applied to the corresponding memory cell.
  (b) Signals of at least four different duration times are generated, and one of the signals of at least four different duration times is selected in accordance with a data signal supplied from the outside and applied to the corresponding memory cell.
  (c) Signals of at least four different pulse numbers, are generated and one of the signals of at least four different pulse numbers is selected in accordance with a data signal supplied from the outside and applied to the corresponding memory cell.

It is desired that the memory cell includes a transistor having a floating gate so that the data is stored in the transistor by the Fowler-Nordheim tunneling in the program mode.

In addition, it is desired that the sense circuit or the plurality of memory cells connected in the matrix include a plurality of reference memory cells having respective threshold values corresponding to the threshold values of the memory cell determined by the program voltage values so that the threshold values of the reference memory cells are compared with the threshold values of the memory cell in the read mode.

DESCRIPTION OF THE PREFERRED EMBODIMENTS

Figure 1:
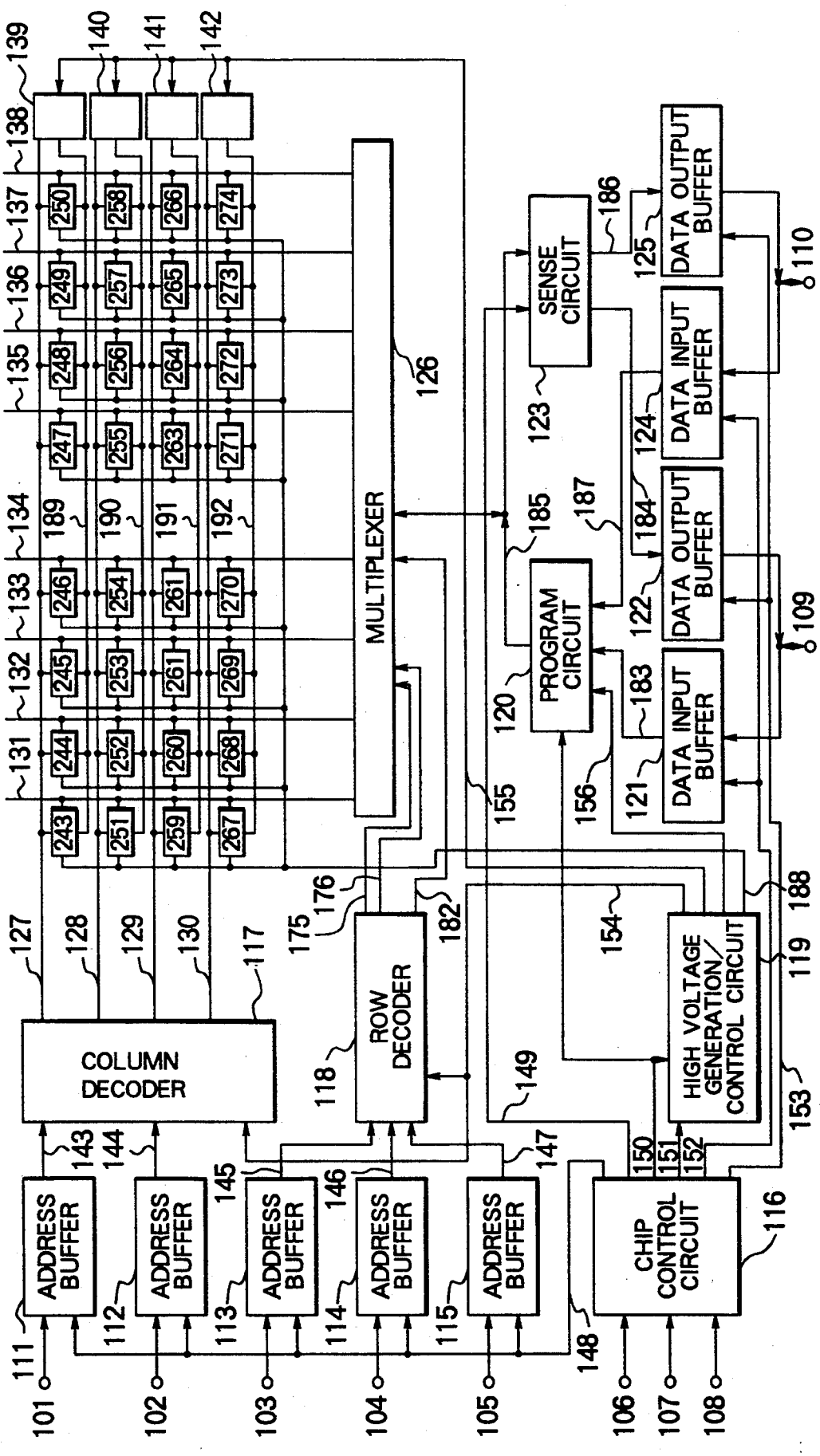
FIG. 1 is a circuit block diagram of an EEPROM of a first embodiment of the present invention.
Figure 2:
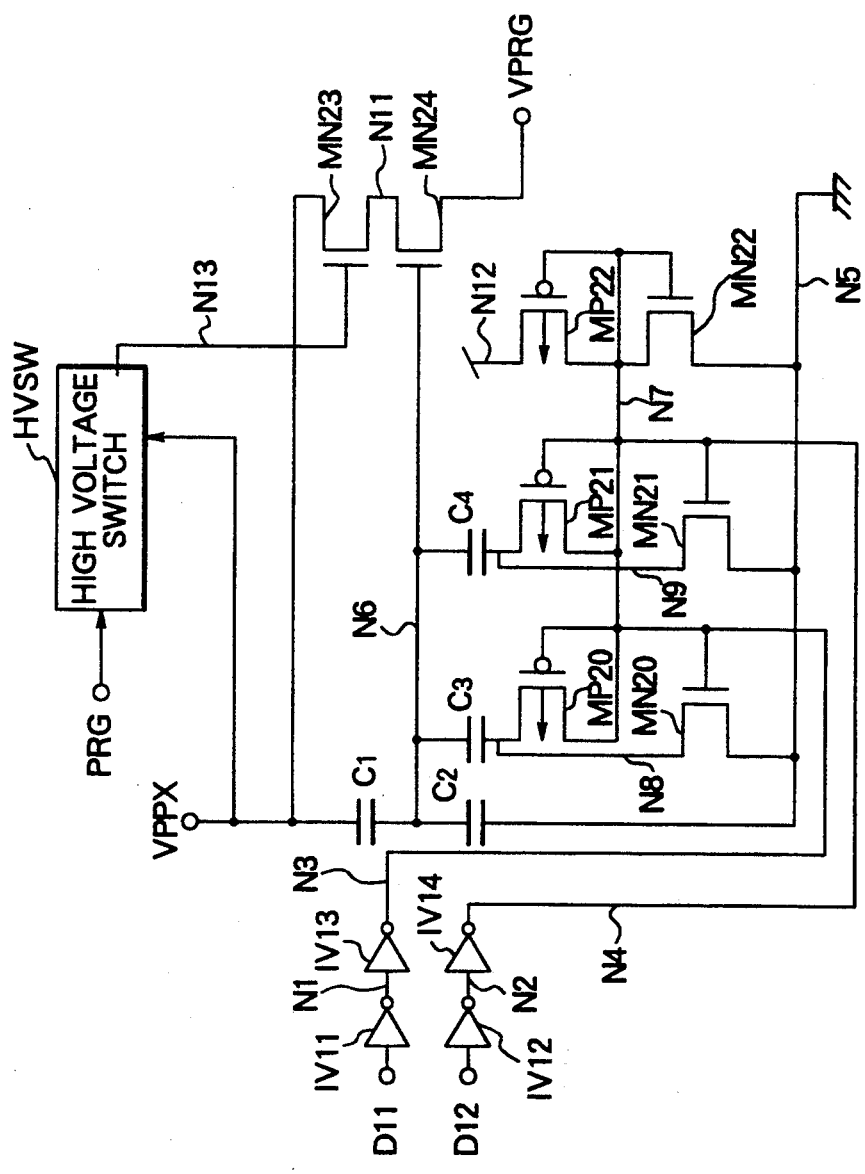
FIG. 2 is a detailed diagram of the program circuit of the first embodiment of the invention.
Figure 3:
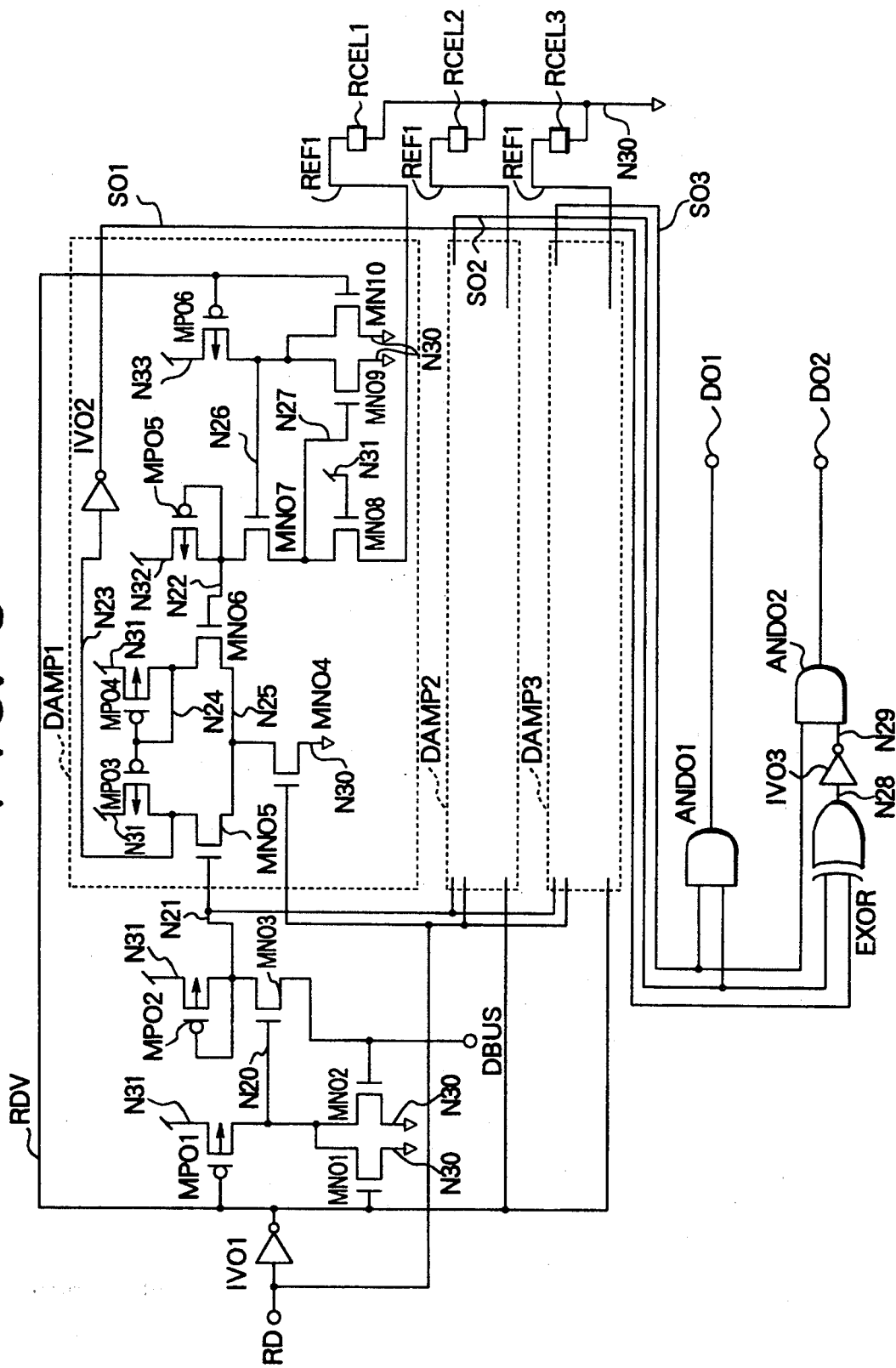
FIG. 3 is a detailed diagram of the sense circuit of the first embodiment of the invention.

The first embodiment of the invention will be described with reference to FIGS. 1 through 3. FIG. 1 is a block diagram of an EEPROM of this embodiment. FIG. 2 is a detailed diagram of the program circuit shown in FIG. 1, and FIG. 3 is a detailed diagram of the sense circuit shown in FIG. 1. Referring to FIG. 1, there are shown address input terminals 101, 102, 103, 104 and 105, control input terminals 106, 107 and 108, and data input/output terminals 109 and 110. There are also shown address buffers 111, 112, 113, 114 and 115, a chip control circuit 116, a high-voltage generation/control circuit 119, a column decoder 117, a row decoder 118, memory cells 243, 244, . . . , 274, memory sense program line selection circuits 139, 140, 141 and 142, a multiplexer 126, a program circuit 120, a sense circuit 123, data input buffers 121 and 124, and data output buffers 122 and 125. The memory cells 243, 244 . . . 274 have their floating gates into which electrons are charged through, for example, a thin insulating film. The shape of the memory cell is not limited to a specific one.

There are also shown column lines (word lines) 127, 128, 129 and 130 which connect the outputs of the column decoder to the selection gates (not shown) of the memory cells and to the memory sense program selection circuits 139 through 142, respectively. Switching control signal lines 175 through 182 are connected to the multiplexer 126. Row lines (bit lines) 131, 132, . . . , 138 are connected to the drains (not shown) of the memory cells and to the multiplexer 126. A read enable signal is fed through a signal line 149 to the sense circuit 123. A program enable signal is fed through a signal line 150 to the program circuit 120 and the high voltage generation/control circuit 119. An erase signal is fed through a signal line 151 to the high-voltage generation/control circuit 119. A data input enable signal is supplied to the data input buffers 121 and 124 through a signal line 152. A data output enable signal is supplied from the chip control circuit 116 through a signal line 153 to the data output buffers 122 and 125.

The output from the program circuit 120 is transmitted through a data line 185 to the sense circuit 123 and the multiplexer 126. A high voltage signal from the high-voltage generation/control circuit 119 is supplied through a high-voltage line 154 to the column decoder 117 and the row decoder 118. The output from the high-voltage generation/control circuit 119 is supplied through a memory sense voltage line 155 to the memory sense program line selection circuits 139, 140, 141 and 142. The output from the high-voltage generation/control circuit 119 is supplied through a program high voltage line 156 to the program circuit 120. A memory ground line 188 is connected to the source terminals (not shown) of the memory cells 243, ..., 274.

The operation of the EEPROM of this embodiment shown in FIG. 1 will be described below.

The EEPROM shown in FIG. 1 operates in any of the read mode, the write mode, the power-down mode (or the standby mode) and the output non-selection mode. The write mode is divided into the erase mode and the program mode.

First, the read mode will be mentioned.

In the EEPROM of this embodiment, three-bit control input data for controlling the operation mode of the EEPROM is supplied to the control input terminals 106, 107 and 108, thereby setting the chip control circuit 116 to the read mode. Then, the address data for a desired memory cell is supplied to the address input terminals 101, 102, 103, 104 and 105. The input address data is buffered in the address buffers 111, 112, 113, 114 and 115. The output data from the address buffers 111 and 112 is decoded by the column decoder 117 to be outputted on the column lines 127, 128, 129 and 130. Of these column lines, the column line selected by the address data is at a high voltage, and the other three lines are at a low voltage. The outputs from the address buffers 113, 114 and 115 are decoded by the row decoder 118 to be outputted on the signal lines 175 through 182, so that the multiplexer 126 connects one of the row lines 131 through 138 to the data line 185. Thus, one of the memory cells (for example, the memory cell 252 at the intersection between the lines 128 and 132) is selected. The chip control circuit 116 produces a high voltage on the signal lines 149 and 153 and a low voltage on the other signal lines 150, 151 and 152. Thus, the sense circuit 123 and the data output buffers 122 and 125 are activated, and the high-voltage generation/control circuit 119, the data input buffers 121 and 124 and the program circuit 120 are deactivated. The high-voltage line 154 is at about the source voltage, the memory cell voltage line 155 is at, for example, 3 V, the program high-voltage line 156 is at, for example, a low voltage, and the memory ground line 188 is grounded. The sense circuit 123 is activated by the high voltage on the signal line 149 to perform amplification, comparison for detection and restoration of the voltage appearing on the data line 185 and produce outputs which are supplied to the data output buffers 122 and 125. The data output buffers 122 and 125 produce at the data input/output terminals 109, 110 the data stored in the selected memory cell.

The erase mode will be described below.

Data from the outside is applied to the control terminals 106, 107, 108 for setting the chip control circuit at the erase mode, and the address data for the column line to be erased is supplied to the address input terminals 101, 102. The chip control circuit 116 produces a low voltage on the signal lines 149, 150, 152 and 153, and a high voltage on the signal line 151. Thus, the high-voltage generation/control circuit 119 is activated, and the program circuit 120, the sense circuit 123, and the data output buffers 122, 125 are inactivated. The high-voltage line 154 is at a high voltage (for example, 20 V), the memory cell voltage line 155 is also at a high voltage (for example, 20 V), the program high-voltage line 156 is at a low voltage or at about the source voltage, and the memory ground line 188 is grounded. As a result, one of the column lines 127, 128, 129,130 is at a high voltage (for example, 20 V). Also, one of the signal lines 189, 190, 191, 192 is at a high voltage (for example, 20 V). Thus, each of the memory cell transistors having the floating gates connected to the selected column line is rendered into a state that its gate is at 20 V, its source is at ground potential, and its drain is at ground potential (because the memory cell transistor is turned on by the gate voltage). Consequently, the Fowler-Nordheim tunneling is caused thereby raising the threshold voltage to, for example, 5 V.

The program mode will be described.

In the program mode, control data is fed to the control input terminals 106, 107, 108, for setting the chip control circuit 116 to the program mode. The address data for the memory cell to be programmed is supplied to the address input terminals 101, 102, 103, 104, 105. The chip control circuit 116 produces a low voltage at the signal line 148, a high voltage on the signal line 150, a low voltage on the signal line 151, a low voltage on the signal line 152, and a low voltage on the signal line 153. Consequently, the high-voltage generation/control circuit 119, the data input buffers 121,124, and the program circuit 120 are activated, and the data input/output buffer 122 and the sense circuit 123 are in-activated. The high-voltage line 154 becomes at a high voltage (for example, 23 V), the memory sense voltage line 155 is at ground potential, the program high-voltage line 156 is at a high voltage (for example, 23 V), and the memory ground line 188 is made in a high-impedance state. As a result, one of the column lines 127, 128, 129, 130 is at a high voltage (for example, 23 V). One of the signal lines 175 through 182 is at a high voltage (for example, 23 V), and the multiplexer 126 is turned on to connect the selected row line to the line 185.

The input data in the program mode is supplied through the data input/output terminals 109, 110 to the data input buffers 121, 124 where it is buffered, and then it is fed to the program circuit 120. The program circuit 120 converts the input data into a program voltage and produces on the data line 185 the program voltage corresponding to the input data. In this embodiment, the program voltage value is a selected one of the four different voltage values (for example, 22 V, 20 V, 18 V, 16 V). The program voltage value may be selected from four or more different voltage values. If the selected column line and row line are respectively 128 and 132, the program voltage is fed through the multiplexer 126 to the row line 132, which is at, for example, 20 V. Since the memory sense voltage line 155 and the column line 128 are at ground potential and 23 V, respectively, the signal line 190 is rendered to the ground potential through the memory sense program line selection circuit 140. Thus, since the memory cell 152 is rendered to a state that its drain is at 20 V and its gate is at the ground potential, the threshold value of the memory cell is reduced to, for example, −0.5 V contrary to the erasing mode.

While in this embodiment only the control data is supplied to the control input terminals 106, 107, 108 in order to select one of the erase mode, the program mode and other modes, this embodiment is not limited to this way. In addition, while the memory cells in one column line are selected at a time in the erase mode, memory cells for one byte or block may be selected.

FIG. 2 is a detailed diagram of the program circuit 120 shown in FIG. 1. Referring to FIG. 2, there are shown a first data input terminal DI1, a second data input terminal DI2, a high-voltage input terminal VPPX, a program enable signal input terminal PRG, and a program voltage signal output terminal VPRG. There are also shown inverter circuits IV11, IV12, IV13, IV14, a high-voltage switch HVSW, capacitors C1, C2, C3, C4, MOS transistors of N-channel enhancement type MN20, MN21, MN22, MN23, MN24, and MOS transistors of P-channel enhancement type MP20, MP21, MP22.

N1 is the output signal line which is connected to the output of the inverter circuit IV11 and to the input of the inverter circuit IV13. N2 is the output signal line which is connected to the output of the inverter circuit IV12 and to the input of the inverter circuit IV14. N3 is the output signal line which is connected to the output of the inverter circuit IV13 and to the gate of the MOS transistor MP20 and the gate of the MOS transistor MN20. N4 is the output signal line which is connected to the output of the inverter circuit IV14 and to the gate of the MOS transistor MP21 and the gate of the MOS transistor MN21. N5 is the grounding node which is connected to ground potential and to one end of the capacitor C2, the source of the MOS transistor MN20, the source of the MOS transistor MN21 and the source of the MOS transistor MN22. An output signal line N7 is connected to the drain of the MOS transistor MP22, the source of the MOS transistor MP21, the source of the MOS transistor MP20 and the drain of the MOS transistor MN22. An output signal line N8 is connected to one end of the capacitor C3, the drain of the MOS transistor MP20 and the drain of the MOS transistor MN20. A signal line N9 is connected to one end of the capacitor C4, the drain of the MOS transistor MP21 and the drain of the MOS transistor MN21. A signal line N6 is connected to one end of the capacitor C1, the other end of the capacitor C2, the other end of the capacitor C3, the other end of the capacitor C4 and the gate of the MOS transistor MN24. A signal line N11 is connected to the source of the MOS transistor MN23 and the drain of the MOS transistor MN24. At a power supply node N12, the power supply is connected to the source of the MOS transistor MP22. A signal line N13 connects a high-voltage switch HVSW to the gate of the MOS transistor MN23. The high-voltage input terminal VPPX is connected to the other end of the capacitor C1, the drain of the MOS transistor MN23 and the high-voltage switch HVSW. The program enable signal input terminal PRG is connected to the control input terminal, not shown, of the high-voltage switch HVSW. The first data input terminal DI1 is connected to the input of the inverter circuit IV11, the second data input terminal DI2 to the input of the inverter circuit IV12, and the output terminal VPRG for the program signal to the source of the MOS transistor MN24.

The first data input terminal DI1 shown in FIG. 2 is connected to the data input buffer 121 shown in FIG. 1. The second data input terminal DI2 is connected to the data input buffer 124 shown in FIG. 1. The high-voltage input terminal VPPX is connected to the high-voltage generation/control circuit 119 shown in FIG. 1. The program enable signal input terminal PRG is connected to the chip control circuit 116 shown in FIG. 1. The output terminal VPRG for the program signal is connected to the multiplexer 126 shown in FIG. 1. The program circuit shown in FIG. 2 converts 2-bit digital data into analog data. When a high voltage (for example, 24 V) is applied to the high-voltage input terminal VPPX and the program enable signal input terminal PRG is at a high voltage, the voltage on the signal line N6 is rendered to a value determined by the capacitors C1, C2, C3, C4 and the signal line N7 as follows.

The voltage on the signal line N6 = {the voltage at the high-voltage input terminal VPPX × the value of the capacitance C1 + the voltage on the signal line N7 × (the value of the capacitor C3 + the value of the capacitor C4)}/CT, where CT = C1 + C2 + C3 + C4.

In this embodiment, the voltages on the signal lines N8 and N9 are changed between the ground potential and the voltage of the signal line N7 (for example, a constant voltage of about 3 V) in accordance with the input data so that the voltage on the signal line N6 is variable depending on the values at the first and second data input terminals DI1 and DI2. In addition, the input data is weighted by making different the values of the capacitors C3 and C4 (for example, the value of the capacitor C3 is twice larger than that of the capacitor C4), so that the voltage value on the signal line N6 can take four values which have a proportional relation. When the program enable signal input terminal PRG is at a high voltage, the high-voltage switch HVSW produces a high voltage on the output line N13, the MOS transistor MN23 is turned on, and the output terminal VPRG for the program signal is at a voltage corresponding to the subtraction of the threshold value of the MOS transistor MN23 from the voltage on the signal line N6. When the signal line N6 is at a voltage of, for example, 21 V, the voltage at the output terminal VPRG is, for example, 20 V. In this embodiment, when the first and second data input terminals DI1 and DI2 are both at a high voltage, the output terminal VPRG is at the lowest voltage (for example, 16 V). When the first and second data input terminals DI1 and DI2 are both at a low voltage, the output terminal VPRG is at the highest voltage (for example, 22 V). When the input terminal PRG is at a low voltage, the signal line N13 is also at a low voltage, the MOS transistor MN23 is turned off, and the output terminal VPRG is in the floating state.

In FIG. 3, there are shown a read signal input terminal RD, a first data output terminal DO1, a second data output terminal DO2, and a memory read data input terminal DBUS. There are also shown inverter circuits IV01, IV02, IV03 which are formed of MOS transistors, two-input logic AND gates AND01, AND02 which are formed of MOS transistors, and a two-input exclusive logic OR gate EXOR which is formed of a MOS transistor. MOS transistors MP01, MP02, MP03, MP04, MP05, MP06 are of the P-channel enhancement type, and MOS transistors MN01, MN02, MN03, MN04, MN05, MN06, MN07, MN08, MN09, MN10 are 10 of the N-channel enhancement type. RCEL1, RCEL2 and RCEL3 are memory cells for reference.

In addition, the drain of the MOS transistor MP01 is connected to the drain of the MOS transistor MN01, the drain of the MOS transistor MN02 and the gate of the MOS transistor MN03. The drain and gate of the MOS transistor MP02, the drain of the MOS transistor MN03 and the gate of the MOS transistor MN05 are connected to each other. The drain of the MOS transistor MP03 and the drain of the MOS transistor MN05 are connected to the input of the inverter circuit IV02. The drain and gate of the MOS transistor MP05, the drain of the MOS transistor MN07, and the gate of the MOS transistor MN06 are connected to each other. The drain of the MOS transistor MP06 is connected to the drains of the MOS transistors MN09 and MN10 and the gate of the MOS transistor MN07. The source of the MOS transistor MN07 is connected to the drain of the MOS transistor MN08 and the gate of the MOS transistor MN09. The output signal from the gate EXOR is supplied to the input of the inverter IV03, the output signal from the inverter circuit IV03 is supplied to the input of the gate AND02.

The circuits DAMP2 and DAMP2 have the same arrangement as the circuit DAMP1 mentioned above.

In FIG. 3, the input terminal RD is connected to the input of the inverter circuit IV01, the gate of the MOS transistor MN04 of the circuit DAMP1 and the circuits DAMP2 and DAMP3. The output RDV from the inverter circuit IV01 is supplied to the gate of the MOS transistor MP01, the gate of the MOS transistor MN01, the gates of the MOS transistors MP06 and MN10 of the circuit DAMP1, and the circuits DAMP2 and DAMP3. The memory read data input terminal DBUS is connected to the gate of the MOS transistor MN02 and the source of the MOS transistor MN03. The first data output terminal DO1 is connected to the output of the gate AND01, and the second data output terminal DO2 to the output of the gate AND02. An output signal line SO1 is connected to the output of the inverter circuit IV02 of the circuit DAMP01 and to the input of the EXOR, and an output line SO2 has one end connected to the output of the corresponding inverter circuit IV02 of the circuit DAMP2 and the other end connected to the input ends of the gates AND01 and EXOR. An output signal line SO3 has one end connected to the corresponding inverter circuit IV02 of the circuit DAMP3 and the other end connected to the input ends of the gates AND01 and AND02. A line REF1 is connected to the source of the MOS transistor MN08 of the circuit DAMP1 and the drain portion of the memory cell RCEL1 for reference. A line REF2 is connected to the source of the MOS transistor MN08 of the circuit DAMP2 and the drain portion of the memory cell RCEL2 for reference. A line REF3 is connected to the source of the MOS transistor MN08 of the circuit DAMP3 and the drain portion of the memory cell RCEL3 for reference. A ground node N30 is connected to the ground nodes of the inverter circuit, logic AND gate and exclusive logic OR gate, the source terminals of the MOS transistors MN01, MN02, MN04, MN09, MN10 and the source portions of the memory cells RCEL1, RCEL2, RCEL3 for reference. A power supply node N31 is connected to the power supply nodes of the inverter circuit, logic AND gate and exclusive logic OR gate, the sources of the MOS transistors MP01, MP02, MP03, MP04, MP05, MP06 and the gate of the MOS transistor MN08.

In FIG. 3, the read signal input terminal RD corresponds to the line 149 shown in FIG. 1, the memory read data input terminal DBUS to the line 185 shown in FIG. 1, the first data output terminal DO1 to the line 184 shown in FIG. 1, and the second data output terminal DO2 to the line 186 shown in FIG. 1. In the read mode, the read signal input terminal RD is at a high voltage, the data input terminal DBUS is at the same potential as the row line of the selected memory cell. Since the line RDV is at a low voltage, the MOS transistor MP01 is turned on, the MOS transistor MN01 is turned off, and the voltage at the node N 20 rises from 0 V. When the voltage at the node N20 rises, the MOS transistor MN03 is turned on, and the memory read data input terminal DBUS is at a voltage corresponding to the voltage at the node N20 subtracted by the threshold value of the MOS transistor MN03. However, when the voltage at the memory read data input terminal DBUS becomes higher than the threshold value of the MOS transistor MN02, the MOS transistor MN02 is turned on, suppressing the potential of the memory read data input terminal DBUS from further increasing. Thus, when the read signal input terminal RD is at a high voltage, the memory read data input terminal DBUS is at about an intermediate voltage between 0 V and the source voltage, or for example 2 V. At this time, if the memory to be read is in the on-state, a current flows from the memory read data input terminal DBUS to the source of the memory cell, so that the potential of the memory read data input terminal DBUS is somewhat reduced (for example, to a voltage of 1.8 V). In this case, since this current flows through the MOS transistor MP02, the voltage at the node N21 is greatly reduced (for example, reduced from 4.2 V to 3.5 V) by selecting the transistor MP02 of a proper size as compared with the voltage at the memory read data input terminal DBUS. Since the voltage at the node N21 is necessarily proportional to the magnitude of the current flowing through the memory cell, the MOS transistor MP01, MOS transistor MN02, and MOS transistors MN03 and MP02 amplify the potential variation at the memory read data input terminal DBUS. The MOS transistors MP03, MP04 and the MOS transistors MN05, MN06, MN04 constitute differential amplifiers, and the nodes N21 and N22 are differential inputs. The MOS transistors MP05, MP06, MN07, MN09, MN10 are analogous to the MOS transistors MP02, MP01, MN03, MN02, MN01, and make similar operation for the line REF1 as that for the memory read data input terminal DBUS.

If the threshold value of the memory cell to be read and the threshold values of the reference memory cells RCEL1, RCEL2 and RCEL3 are respectively assumed to be, for example, 1.5 V, 2.5 V, 0.5 V, and −1.5 V, the following condition is satisfied.

Voltage on REF3 < voltage on REF2 < voltage at memory read data input terminal DBUS < voltage on REF1 Thus, the output signal line SO1 of the circuit DAMP1 is at a low voltage, the output signal line SO2 of the circuit DAMP2 is at a high voltage, and the output signal line SO3 of the circuit DAMP3 is at a high voltage. The threshold value of the reference memory cell is previously set in the test mode or the like, and will not be described in this embodiment. As a result, the first data output terminal DO1 is at a high voltage, and the second data output terminal DO2 is at a low voltage. Similarly, when the threshold value of the memory cell is 3.5 V, the first data output terminal DO1 is at a high voltage, the second data output terminal DO2 is at a high voltage. When the threshold value of the memory cell is −0.5 V, the first data output terminal DO1 is at a low voltage, and the second data output terminal DO2 is at a high voltage. When the threshold value of the memory cell is −2.5 V, the first data output terminal DO1 is at a low voltage, and the second data output terminal DO2 is at a low voltage. Thus, the data stored in the memory cell can be satisfactorily read out.

Figure 9:
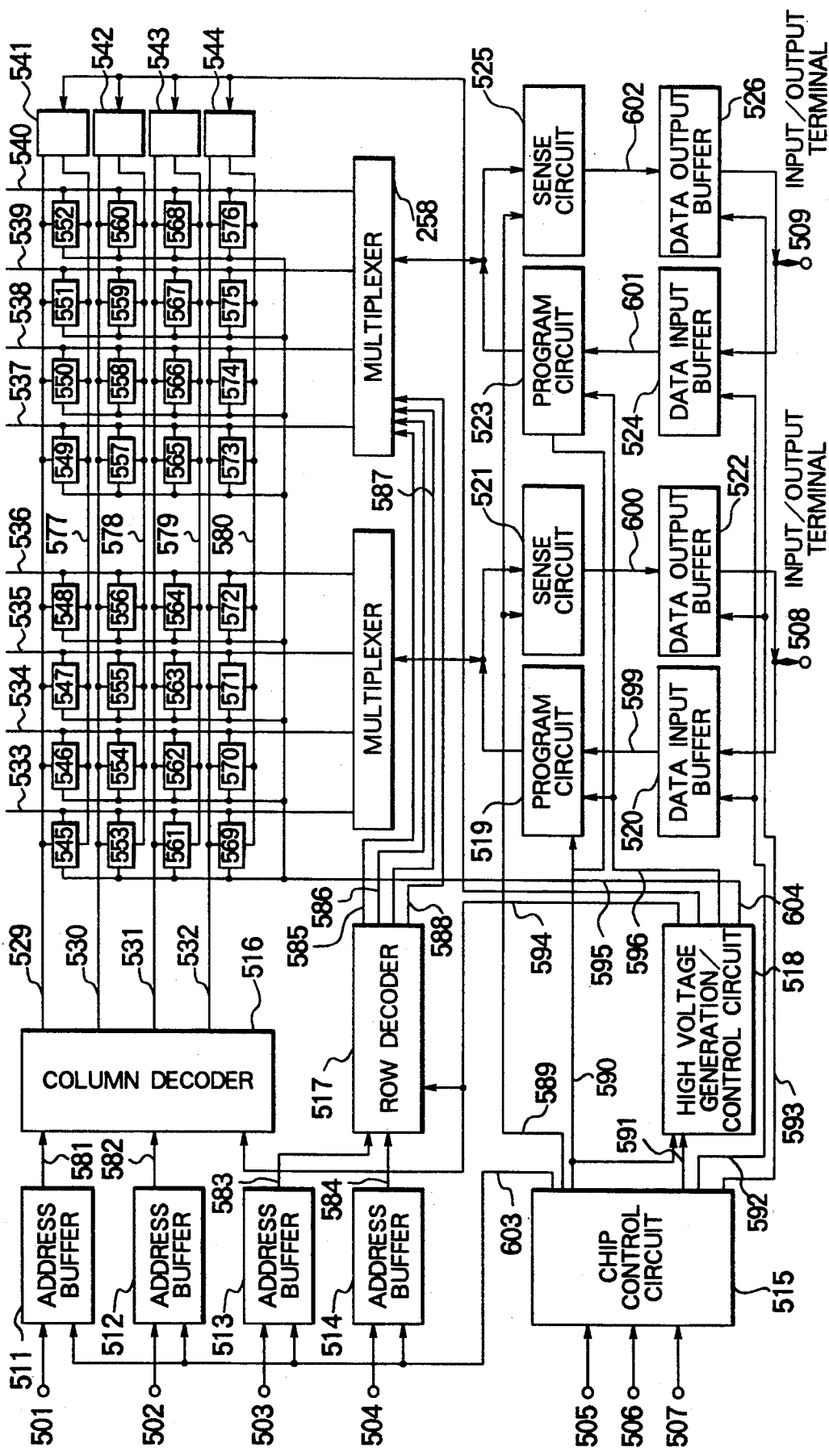
FIG. 9 is a circuit block diagram of the conventional EEPROM.

While the prior art shown in FIG. 9 has the four address inputs and two outputs provided for 32 memory cells, the embodiment shown in FIG. 1 has five address inputs and two outputs provided for 32 memory cells. Therefore, according to this embodiment, data of twice as large as the amount of data in the prior art can be written into and read from the memory cells of the same number. Thus, the capacity of the semiconductor memory can be remarkably increased as compared with the prior art. In addition, if the capacity of storage in the embodiment is the same as in the prior art, the number of memory cells in this embodiment can be reduced to a half or less than that in the prior art. Thus, the area of the integrated memory chip is greatly reduced to about a half so that the cost can be much lowered.

This invention is not limited to the above embodiment, but can take other various modifications without departing from the scope of the invention. For example, while in this embodiment the program voltage in the program mode is generated from the program circuit, it may be generated by the high-voltage generation/control circuit or other circuits. While in this embodiment the reference memory cell is included in the sense circuit, it may be included in part of the memory cells which are arranged in a matrix. In addition, while in this embodiment the four threshold values are set in the memory cell for convenience of explanation, more threshold values may be used.

Moreover, while the function of the EEPROM of this embodiment is simplified for convenience of explanation, other functions may be added to this function. For example, a verify mode or the like after programming can be easily added.

Also, while in this embodiment the memory cells are formed of transistors with floating gates and select transistors, the invention is not limited to this structure and may be of any structure in which the threshold values of the memory cells are changed in proportion to the program voltage value in the program mode.

According to this embodiment, as described above, twofold or more data can be written into and read from the same number of memory cells as that of the prior art, and thus it is possible to realize a semiconductor memory of which the capacity is much larger than the conventional one. If the storage capacity is assumed to be constant, the number of memory cells in the semiconductor memory of the invention can be reduced to a half or below as compared with the prior art. Thus, when this memory is integrated as an IC memory, the chip area can be substantially halved, or greatly reduced, thus leading to low cost.

Moreover, according to this embodiment, in addition to the above effects, the external connection terminals are compatible with those of the conventional EEPROM. Thus, there is no need to reduce the function of the prior art or add new terminals for function of this invention. This is because this invention is so constructed that parallel data access can be made to the program circuit and the sense circuit from a plurality of data input/output terminals.

Also, the sense circuit has a plurality of reference-purpose memory cells of different threshold values, and the memory cell to be read is compared with the reference memory cells so that high-precision reading can be realized. For example, another sense system would be considered in which the absolute value of current flowing in a memory cell is detected by a load transistor or the like. According to this system, if the current value in the memory cell is not stable due to the variation of characteristics caused upon production, it would be possible that the current value cannot be satisfactorily detected. On the other hand, the sense circuit of the invention do not compare the absolute values of currents but compare relative values to the reference cells. Therefore, the above problem can be removed, and as a result the detection precision can be increased.

The second embodiment of the invention will be described with reference to FIGS. 4 and 5. While in the first embodiment at least four signals of different voltage values are generated and stored in memory cells in the program mode, in the second embodiment at least four signals of different program voltage duration times are generated and stored in memory cells.

In this second embodiment, only the program circuit 120 is different from that shown in FIG. 1, and the other elements are the same as in the first embodiment. The program circuit 120 of this embodiment will be mentioned with reference to FIG. 4.

Figure 4:
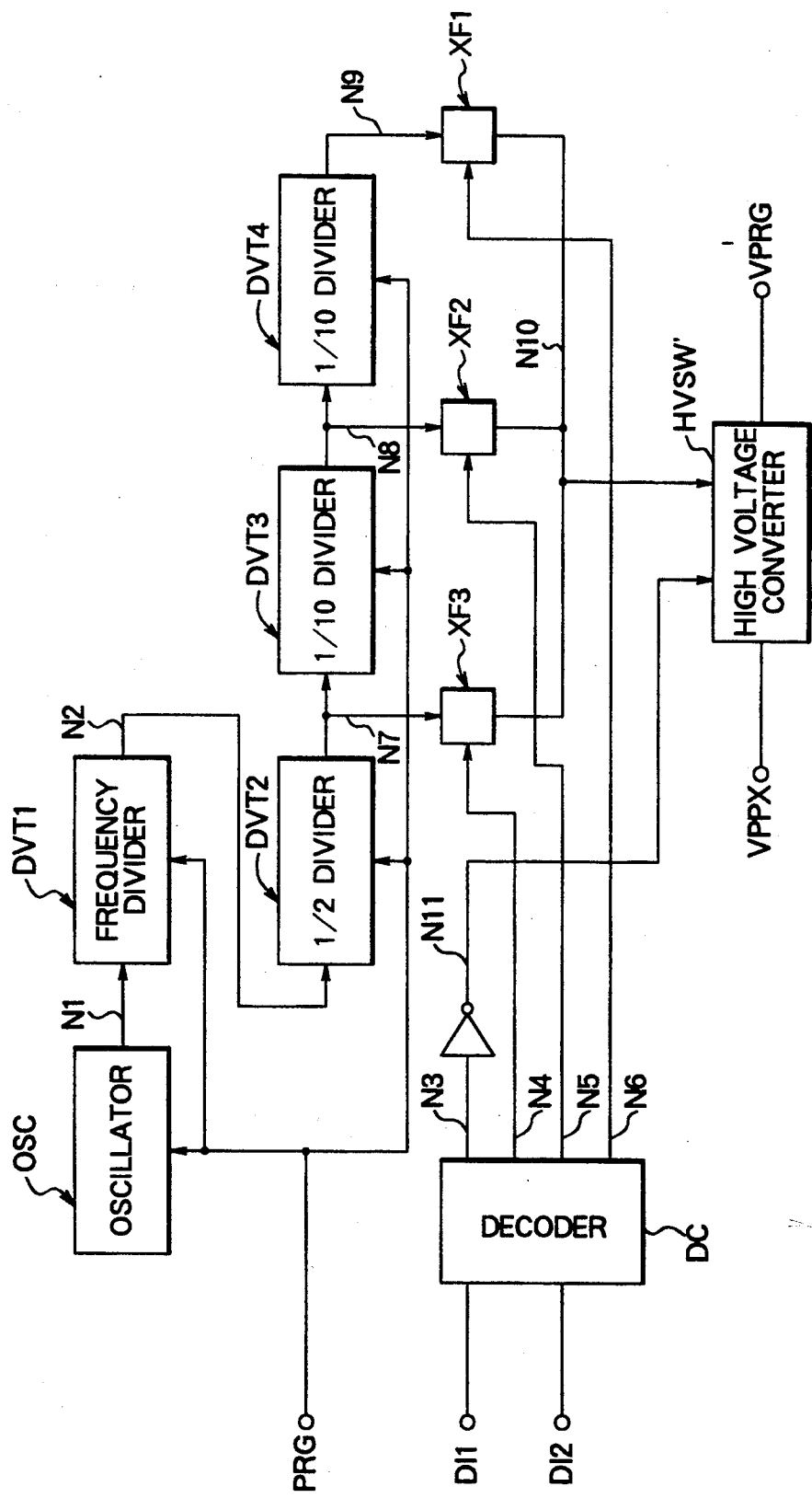
FIG. 4 is a detailed diagram of the program circuit of a second embodiment of the invention.

Referring to FIG. 4, there are shown a first data input terminal DI1, a second data input terminal DI2, a high voltage input terminal VPPX, a program enable signal input terminal PRG, and a program voltage output terminal VPRG. There are also shown an oscillator OSC of, for example, about one MHz, and frequency dividing circuits DVT1, DVT2, DVT3. The frequency dividing circuit DVT1 is formed of, for example, a series circuit of three 1/10-frequency dividers (i.e. a 1/1000-frequency divider), the frequency dividing circuit DVT2 is formed of, for example, a ½-frequency divider, and the frequency dividing circuit DVT3 is formed of, for example, 1/10-frequency divider. In addition, there are shown a frequency dividing circuit DVT4 which is formed of, for example, a 1/10-frequency divider, a high-voltage converter HVSW', a decoder circuit DC, an inverter circuit IV1 and transfer gates XF3, XF2, XF1 XF0.

In FIG. 4, the signal line N1 transmits the output from the oscillator OSC to the frequency divider DVT1. The signal line N2 transmits the output from the frequency divider DVT1 to the frequency divider DVT2. The signal line N7 transmits the output from the frequency divider DVT2 to the frequency divider DVT3 and transfer gate XG3. The signal line N8 transmits the output from the frequency divider DVT3 to the frequency divider DVT4 and transfer gate XF2. The signal line N9 transmits the output from the frequency divider DVT4 to the transfer gate XF1. The signal line N3 transmits the output from the decoder DC to the inverter circuit IV1. The signal line N4 transmits the output from the decoder circuit DC to the control input of the transfer gate XF3. The signal line N5 transmits the output from the decoder DC to the control input of the transfer gate XF2. The signal line N6 transmits the output from the decoder DC to the control input of the transfer gate XF1. The signal line N8 transmits the output from SHRG3 to the transfer gate XF3. The signal line N11 transmits the output from the inverter circuit IV1 to the control input of the high-voltage conversion circuit HVSW'. The signal line N10 transmits the outputs from the transfer gates XF1, XF2 and XF3 to the high-voltage conversion circuit HVSW'. The program enable input terminal PRG is connected to the oscillator OSC, and dividers DVT1, DVT2, DVT3, DVT4 and high-voltage conversion circuit HVSW'. The first data input terminal DI1 and the second data input terminal DI2 are connected to the decoder DC, the output of the high-voltage input terminal VPPX is connected to the high-voltage conversion circuit HVSW', and the program voltage output terminal VPRG is connected to the output of the high-voltage conversion circuit HVSW'.

In FIG. 4, the data input terminal DI1 is connected to the signal line 183 shown in FIG. 1, the second input terminal DI2 to the signal line 187 shown in FIG. 1, the high-voltage input terminal VPPX to the signal line 156 shown in FIG. 1, the program enable signal input terminal PRG to the signal line 150 shown in FIG. 1, and the program voltage output terminal VPRG to the signal line 185 shown in FIG. 1.

The operation of the arrangement shown in FIG. 4 will be described with reference to the timing chart of FIG. 5.

Figure 5:
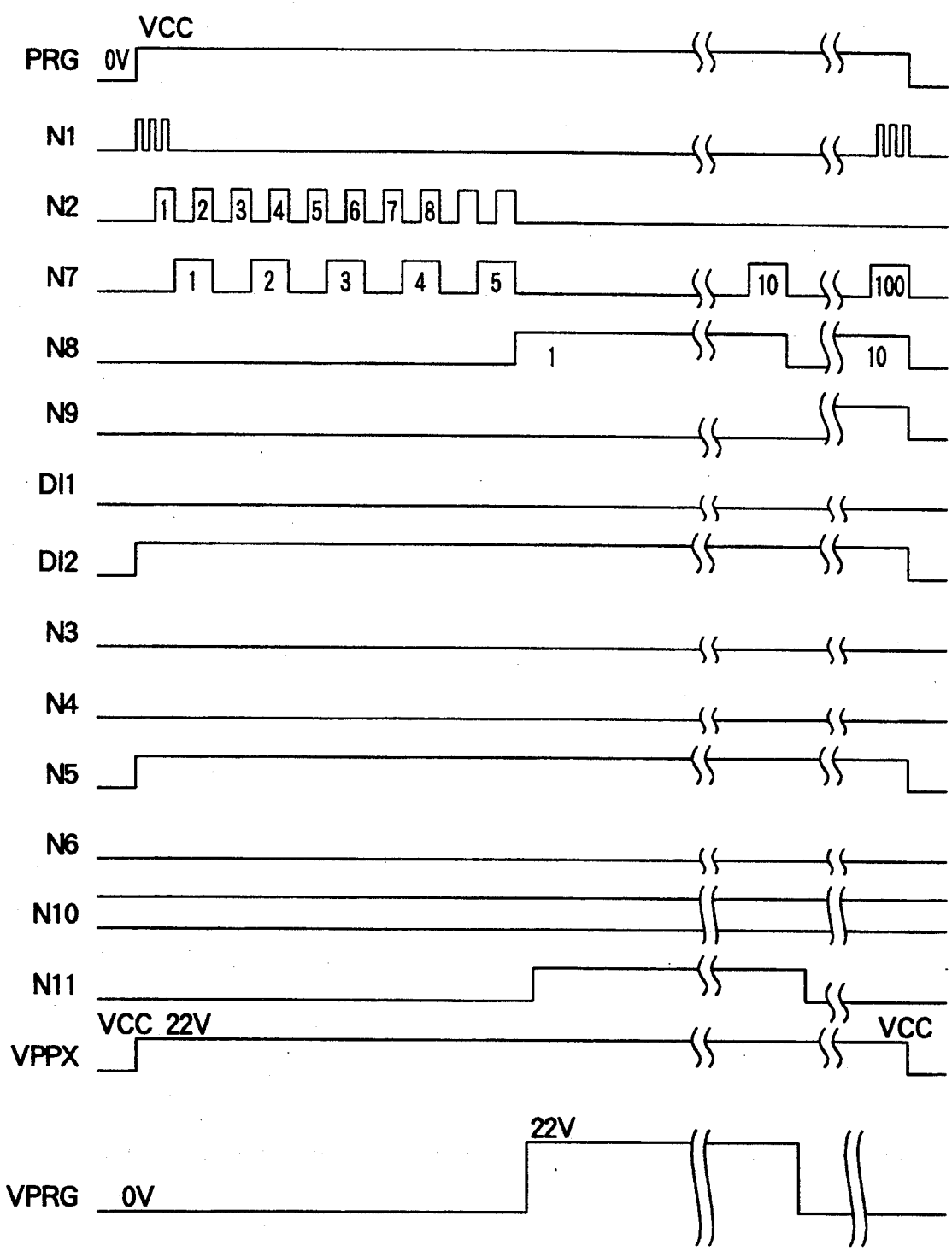
FIG. 5 is a timing chart useful for explaining the second embodiment of the invention.

In FIG. 5, voltage waveforms at respective nodes are shown in a time series, in a case that a low voltage is applied to the first data input terminal DI1 and a high voltage is applied to the second data input terminal DI2. First, the enable signal is supplied through the program enable signal input terminal PRG to all circuits except for the decoder DC. When the enable signal is changed from the low voltage to the high voltage, the oscillator OSC starts oscillating, and the frequency dividers DVT1, DVT2, DVT3, DVT4 start their frequency dividing operations, so that the high-voltage conversion circuit HVSW' is activated. When the high voltage is applied to the program enable signal input terminal PRG, data is supplied to the first data input terminal DI1 and the second data input terminal DI2, and the voltage at the high-voltage input terminal VPPX is changed from the source voltage to a high voltage (for example, 22 V). If one cycle of the signal on the signal line N1 is assumed to be one microsecond, the frequency is divided by one thousand at the frequency divider DVT1, so that the divider produces a signal of which one cycle is one millisecond. The decoder DC decodes the data at the first and second data input terminals DI1 and DI2, so that the signal lines N3, N5, N4 and N6 are at a low voltage, high voltage, low voltage and low voltage, respectively. The frequency dividers DVT1, DVT2, DVT3, DVT4 are each formed of, for example, a D-type flip-flop having a reset function of the trailing-edge triggering type in synchronizing clock operation. The signal lines N1, N2, N7, N8 are connected to the clock terminals of the frequency dividers DVT1, DVT2, DVT3, DVT4, respectively. Since the signal line N5 is at the high voltage, and since the signal lines N3, N4, N6 are at the low voltage, the signal line N11 is at the high voltage, and the transfer gates XF3, XF1 are nonconductive. In addition, the transfer gate XF2 is conductive, and the signal line N8 is electrically connected to the signal line N10. When the pulse width of the signal on the signal line N2 is, for example, 0.5 millisecond, the pulse width of the output from each frequency divider is such that the width of the signal on the signal line N7 is one millisecond, the width of the signal on the signal line N8 is 10 milliseconds, and the width of the signal on the signal line N9 is 100 milliseconds. One of these pulses on the respective signal lines is selected and fed to the high-voltage conversion circuit HVSW' in accordance with the data fed to the first and second data input terminals DI1 and DI2. When the signal line N3 is at the high voltage, the high-voltage conversion circuit HVSW' is rendered in-active, and produces no program pulse. The high-voltage conversion circuit HVSW' converts the voltage on the signal line N10 into a high voltage. When both the program enable signal input terminal PRG and the signal line N3 are at the high voltage, the voltage value at the high-voltage input terminal VPPX is produced at the program voltage output terminal VPRG. Therefore, according to the operation mentioned above, when the first data input terminal DI1 and the second data input terminal DI2 are low and high, respectively, a pulse having a width of 100 milliseconds and a height of, for example, 22 V is produced at the program voltage output terminal VPRG. When other data is supplied to the first and second data input terminals DI1, DI2, a similar operation is also performed to produce the program pulse width corresponding to the data.

The width, or dulation time of the program pulse is not necessary to be fixed. While in this embodiment each input data is directly proportional to the logarithm of the pulse width, this relation is not necessary to be satisfied, provided that the input data satisfies a relationship in magnitude with respect to the threshold values of the memory cells or the reference_memory cells as mentioned hereafter.

The third embodiment of the invention will be described with reference to FIGS. 6 and 7. While in the first embodiment at least four signals of different voltages are generated and stored in memory cells in the program mode, in the third embodiment at least four different program voltage pulse trains are produced and stored in memory cells.

In the third embodiment, only the program circuit 120" is different from that shown in FIG. 1, and the other elements are the same as those in the first embodiment. The program circuit 120" of the third embodiment will be described with reference to FIG. 6.

Figure 6:
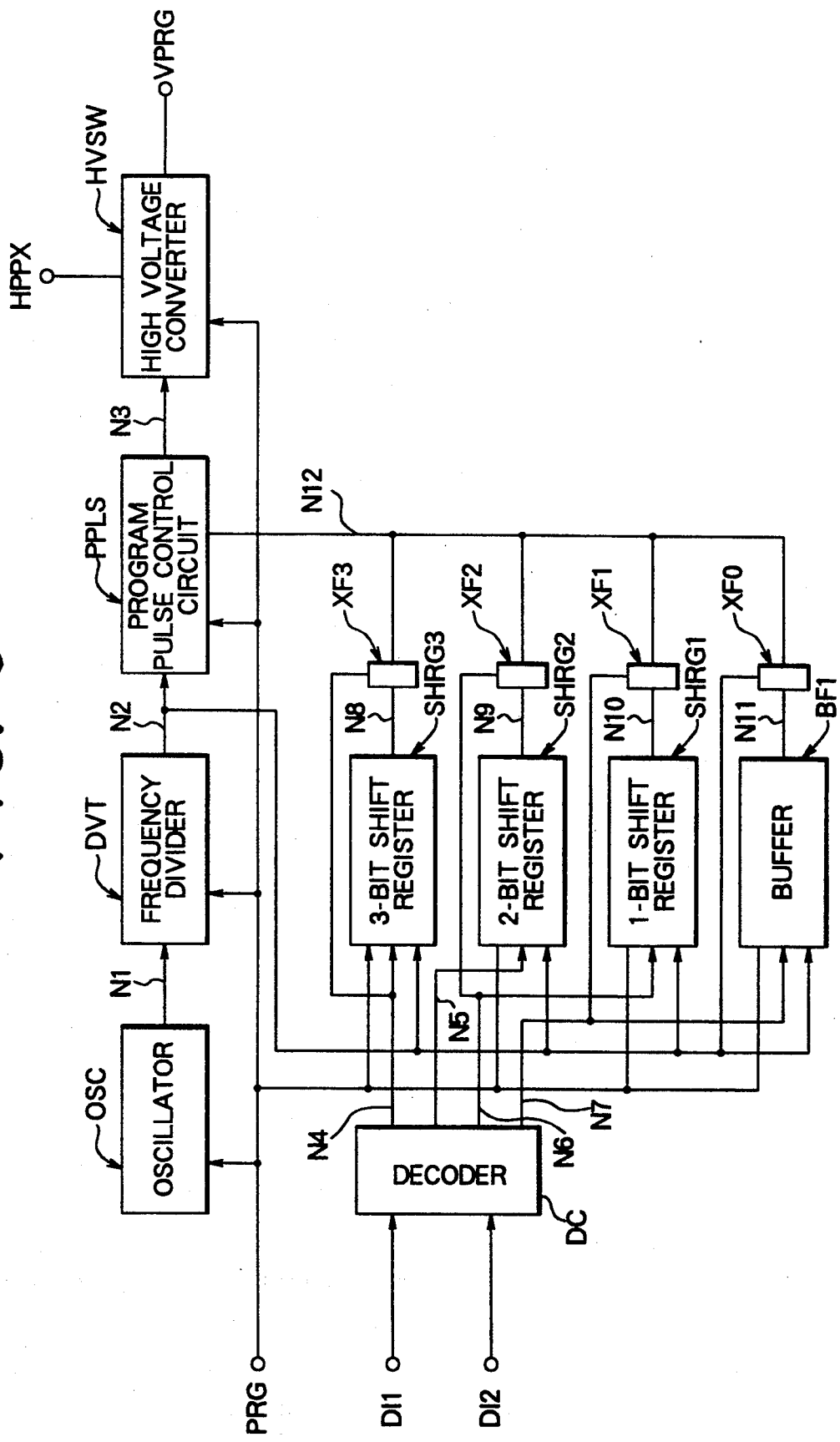
FIG. 6 is a detailed diagram of the program circuit of a third embodiment of the invention.
Figure 7:
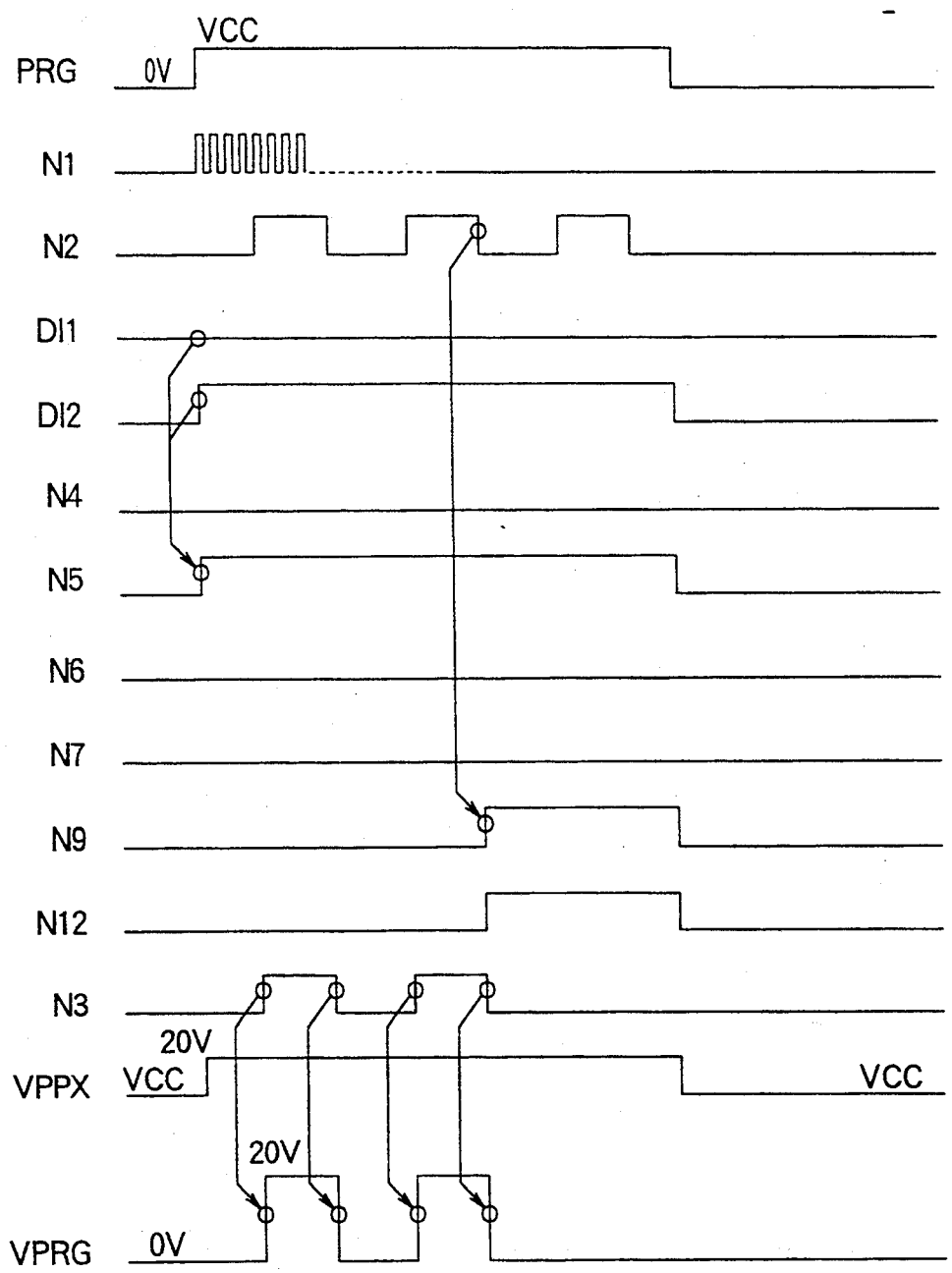
FIG. 7 is a timing chart useful for explaining the third embodiment of the invention.

FIG. 6 shows in detail the program circuit 120' corresponding to the program circuit shown in FIG. 1. Referring to FIG. 6, there are shown a first data input terminal DI1, a second data input terminal DI2, a high-voltage input terminal VPPX, a program enable signal input terminal PRG, and a program voltage output terminal VPRG. Also, there are shown an oscillator OSC which oscillates at, for example, about one MHz, a frequency dividing circuit DVT which is formed of, for example, a series circuit of three 1/10-frequency dividers (i.e. a 1/1000-frequency divider), and a pulse count control circuit PPLS for controlling the pulse number of the program pulse signal. In addition, there are shown a high-voltage conversion circuit HVSW', a decoder circuit DC, a three-bit shift register SHRG3, a two-bit shift register SHRG2, a one-bit shift register SHRG1, a buffer circuit BF1, and transfer gates XF3, XF2, XF1 and XF0.

In FIG. 6, the signal line N1 connects the output terminal of the oscillator OSC to the input terminal of the frequency divider DVT. The signal line N2 connects the output terminal of the frequency divider DVT to the input terminals of the pulse count control circuit PPLS, shift registers SHRG3, SHRG2, SHRG1 and buffer circuit BF1. The signal line N3 connects the output terminal of the pulse count control circuit PPLS with the input terminal of the high-voltage conversion circuit HVSW'. The signal line N4 connects the output terminal of the decoder DC and the input terminals of the shift register SHRG3 and transfer gate XF3 with each other. The signal line N5 connects the output terminal of the decoder DC to the input terminals of the shift register SHRG2 and transfer gate XF2. The signal line N6 connects the output terminal of the decoder DC to the input terminals of the shift register SHRG1 and transfer gate XF1. The signal line N7 connects the output terminal of the decoder DC to the input terminals of the buffer circuit BF1 and transfer gate XF0. The signal line N8 connects the output terminal of the shift register SHRG3 to the input terminal of the transfer gate XF3. The signal line N9 connects the output terminal of the shift register SHRG2 to the input terminal of the transfer gate XF2. The signal line N10 connects the output terminal of the shift register SHRG1 to the input terminal of the transfer gate XF1. The signal line N11 connects the output terminal of the buffer circuit BF1 to the input terminal of the transfer gate XF0. The signal line N12 connects the output terminals of the transfer gates XF0, XF1, XF2, XF3 to the input terminal of the pulse count control circuit PPLS.

The signal at the program enable signal input terminal PRG is supplied to the oscillator OSC, frequency divider DVT, pulse count control circuit PPLS, high-voltage conversion circuit HVSW', shift registers SHRG3, SHRG2, SHRG1 and buffer circuit BF1. The input signals at the first and second data input terminals DI1, DI2 are supplied to the decoder DC. The input signal at the high-voltage input terminal VPPX is fed to the high-voltage conversion circuit HVSW', and the output signal at the program voltage output terminal VPRG is produced from the high-voltage conversion circuit HVSW'. In FIG. 6, the first data input terminal DI1 is connected to the signal line 183 shown in FIG. 1, the second data input terminal DI2 is connected to the signal line 187 shown in FIG. 1, the high-voltage input terminal VPPX is connected to the signal line 156 shown in FIG. 1, the program enable signal input terminal PRG is connected to the signal line 150 shown in FIG. 1, and the program voltage output terminal VPRG is connected to the signal line 185 shown in FIG. 1.

The operation will be described with reference to the timing chart of FIG. 7. In FIG. 7, voltage waveforms at respective nodes are shown in time series, and it is shown that the first data input terminal DI1 and the second data input terminal DI2 respectively; receive a low voltage and a high voltage. First, the enable signal is supplied through the program enable signal input terminal PRG to all circuits except for the decoder DC. When the enable signal is changed from the low voltage to the high voltage, the oscillator OSC starts oscillating, and the frequency divider DVT starts its frequency dividing operation, so that the pulse count control circuit PPLS and the high-voltage conversion circuit HVSW' are activated and that the shift registers (SHRG3, SHRG2, SHRG1) are released from reset. When the high voltage is applied to the program enable signal input terminal PRG, data is supplied to the first data input terminal DI1 and the second data input terminal DI2, and the voltage at the high-voltage input terminal VPPX is changed from the source voltage to a high voltage (for example, 22 V).

If one cycle of the signal on the signal line N1 is assumed to be one microsecond, the frequency is divided by one thousand at the frequency divider DVT, so that the divider produces on the signal line N2 a signal of which one cycle is one millisecond.

The decoder DC decodes the data at the first and second data input terminals DI1 and DI2, so that the signal lines N4, N5, N6 and N7 are at a low voltage, high voltage, low voltage and low voltage, respectively. The signals on the signal lines N4, N5, N6 are supplied to the inputs of the shift registers SHRG3, SHRG2, SHRG1. The shift registers SHRG1 through SHRG3 are each formed of, for example, a D-type flip-flop having a reset function of the trailing-edge triggering type in synchronizing clock operation. The frequency divider DVT is also formed of a D-type flip-flop. The signal line N2 is connected to the clock terminals of the shift registers SHRG1 through SHRG3. Since the signal line N5 is at the high voltage, and the signal lines N4, N6, N7 are at the low voltage, the signal lines N8, N10, N11 remain low even though the clock is fed to the signal line N2. The signal line N9 is rendered to the high voltage at ending of the two clock pulses on the signal line N2. The transfer gates XF3, XF1, XF0 are nonconductive since the signal lines N8, N10, N11 are low. The transfer gate XF2 is conductive since the signal line N5 is high. The signal line N9 is electrically connected to the signal line N12.

The signal on the signal line N12 is supplied to the reset terminal of the pulse count control circuit PPLS. The program count control circuit buffers the input signal on the signal line N2 until the reset signal appears. Therefore, two decoded clock pulses from input data are produced on the signal line N3. The high-voltage conversion circuit HVSW' converts the voltage on the signal line N3 into a high voltage. When both the program enable signal input terminal PRG and the signal line N3 are high voltages, the voltage value at the high-voltage input terminal VPPX is produced at the program voltage output terminal VPRG. Therefore, according to the operation mentioned above, when the first and second data input terminals DI1 and DI2 are respectively at the low and high voltages, two pulses each of which has a width of 0.5 millisecond and a height of, for example, 20 V are produced at the program voltage output terminal VPRG. When other data are supplied to the first and second data input terminals DI1 and DI2, the similar operation is performed to produce program pulses the number of which is determined by the data value.

The number of program pulses do not necessarily have to be fixed, but may be a larger number (for example, 0 pulse for (1 1), 10 pulses for (1 0), 20 pulses for (0 1), 30 pulses for (0 0)). In this case, the width of each program pulse has to be reduced. In addition, while in this embodiment the number of pulses is directly proportional to the input data, this relation is not necessary to be satisfied provided that the threshold values of the memory cells or the reference memory cells, as described later, satisfy a given or relationship in magnitude with the input data.

The fourth embodiment of the invention will be described with reference to FIG. 8. This embodiment is an expanded modification of the first, second and third embodiments, or a memory of $2^n$ bits $\times$ m structure. In this embodiment, one memory cell for simplicity is able to store four different values. A memory of $n=2$ will be described below.

Figure 8:
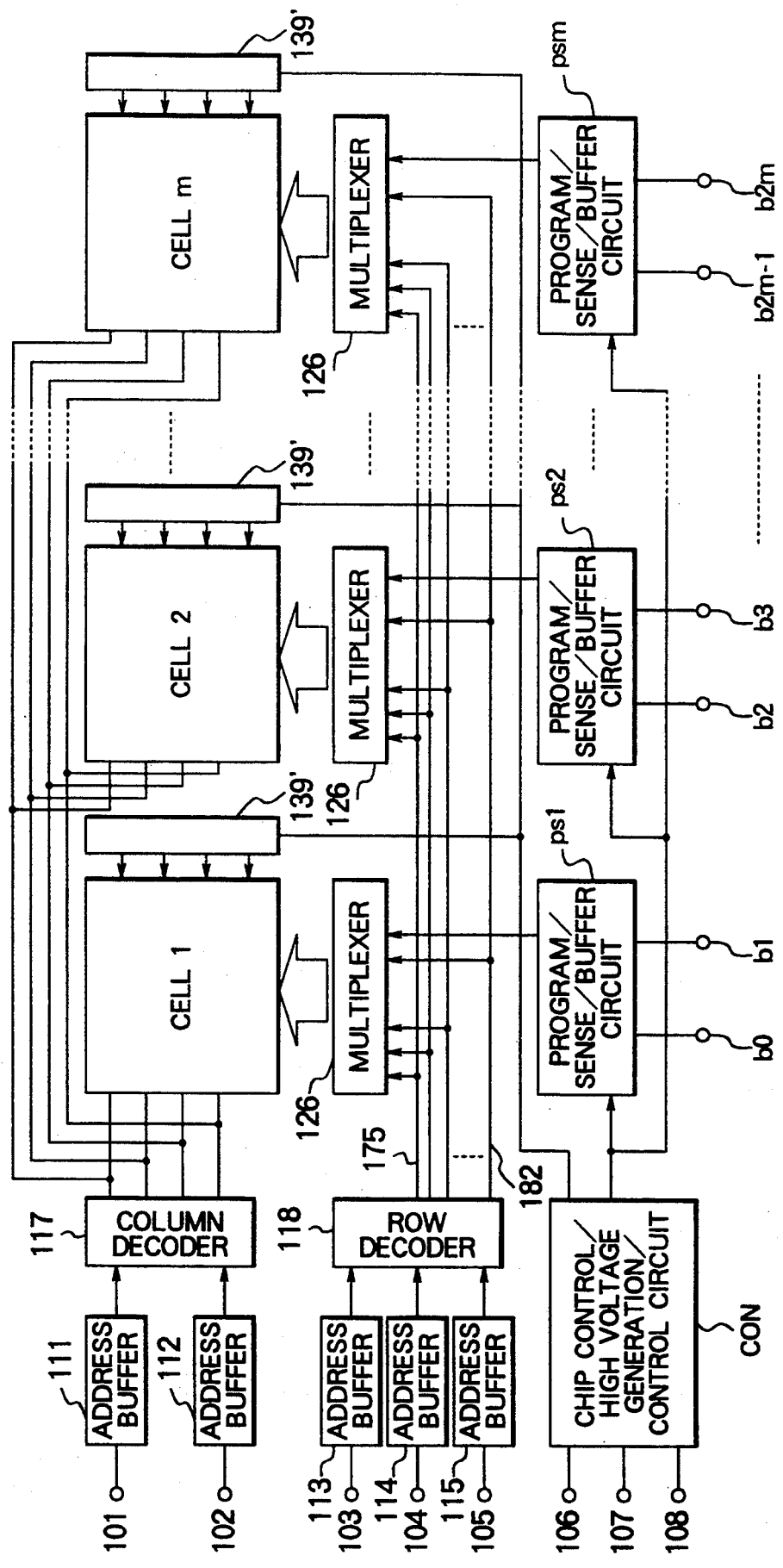
FIG. 8 is a block diagram of a fourth embodiment of the invention.

FIG. 8 shows the memory of this embodiment. Referring to FIG. 8, there are shown blocks CELL1 through CELLm which have the same memory cells 243, 244 . . . 274. The address buffers 111, 112, . . . , 115, the row decoder 118, the column decoder 117 and the multiplexer 126 are the same as those represented by like reference numerals in FIG. 1. In FIG. 8, the block con includes the chip control circuit 116 and high-voltage generation/control circuit 119 shown in FIG. 1. Also, in FIG. 8, the blocks, ps1, ps2, . . ., psm each include the program circuit 120, sense circuit 123, data input buffers 121, 124 and data output buffers 122, 125 shown in FIG. 1, and are hereinafter called the program blocks. The construction and operation of the program circuit 120 in each program block are the same as those of the program circuit 120 shown in the first, second and third embodiments.

The input terminals b0 and b1 of the program block ps1 are respectively connected to the LSB and the second bit of the data bus which has a bus width of 2 m bits. The input terminals b0 and b1 correspond to the data input/output terminals 109 and 110 shown in FIG. 1, respectively. Similarly, the input terminals b2 and b3 of the program block ps2 are connected to the third bit and the fourth bit of the 2 m bit data bus. The input terminals b2m−1 and b2m of the program block psm are connected to the (2 m−1)th bit and MSB of the 2 m bit data bus, respectively. Each two bits of the 2 m bit data bus shows 2 n, or four different values of data. Therefore, by using each two bits of the 2 m bit data bus, it is possible to transmit m different data each having four different values to the program blocks ps1, ps2, . . . , psm. The program blocks ps1, ps2, . . . , psm, respectively, each supply four different values of received data to the memory cells CELL1, CELL2, . . . , CELLm to be stored at a certain address. The way to store is the same as mentioned in the third embodiment. Therefore, a large number of data can be effectively transmitted to a four-value memory.

We claim:

1. An electrically erasable non-volatile semiconductor memory device comprising:

a plurality of row lines and column lines;

a plurality of memory cells connected in a matrix to said plurality of row lines and column lines;

selection means for selecting a desired one of said plurality of memory cells;

write-control means for writing data into said plurality of memory cells, said write-control means including means for presetting at least four voltage signals having different voltage values, and means for selecting one of said four voltage signals according to a data signal externally applied thereto and for applying said selected voltage signal to said selected memory cell; and read-control means for reading out data written into said selected memory cell and converting the data read-out from said selected memory cell into a data signal corresponding to one of said four voltage signals.

2. An electrically erasable non-volatile semiconductor memory device according to claim 1, wherein each of said memory cells includes a transistor having a floating gate.

3. An electrically erasable non-volatile semiconductor memory device according to claim 1, wherein said data is written into said selected memory cell by a Fowler-Nordheim tunneling current.

4. An electrically erasable non-volatile semiconductor memory device according to claim 1, wherein said plurality of memory cells include a plurality of reference memory cells which are used for comparison of the data read out of said selected memory cell.

5. An electrically erasable non-volatile semiconductor memory device according to claim 1, further comprising input means including at least two input terminals to which input signals are externally applied so that said data signal is determined by a combination of the input signals applied to said at least two input terminals.

6. An electrically erasable non-volatile semiconductor memory device comprising:

a plurality of row lines and column lines;

a plurality of memory cells connected in a matrix to said plurality of row lines and column lines;

selection means for selecting a desired one of said plurality of memory cells;

write-control means for writing data into said plurality of memory cells, said write-control means including means for producing a plurality of different signals, and means for selecting one of said different signals according to a data signal externally applied thereto and applying said selected one of said different signals to said selected memory cell; and read-control means for reading out data written into said selected memory cell and converting the data read-out from said selected memory cell into an output data signal corresponding to the data signal applied to said write-control means.

7. An electrically erasable non-volatile semiconductor memory device according to claim 6, further comprising input means including at least two input terminals to which input signals are externally applied so that said data signal is determined by a combination of the input signals applied to said at least two input terminals.

8. An electrically erasable non-volatile semiconductor memory device according to claim 6, wherein each of said memory cells includes a transistor having a floating gate.

9. An electrically erasable non-volatile semiconductor memory device according to claim 6, wherein said data is written into said selected memory cell by a Fowler-Nordheim tunneling current.

10. An electrically erasable non-volatile semiconductor memory device according to claim 6, wherein said plurality of memory cells includes a plurality of reference memory cells which are used for comparison of the data read out of said selected memory cell.

11. An electrically erasable non-volatile semiconductor memory device comprising:

a plurality of row lines and column lines;

a plurality of memory cells connected in a matrix to said plurality of row lines and column lines;

selection means for selecting a desired one of said plurality of memory cells;

write-control means for writing data into said plurality of memory cells, said write-control means including means for presetting at least four different pulse signals of different pulse numbers, means for selecting one of said four different pulse signals according to a data signal externally applied thereto and applying said selected pulse signal to said selected memory cell; and read-control means for reading out data written into said selected memory cell and converting the data read-out from said selected memory cell into a data signal corresponding to one of said four pulse signals.

12. An electrically erasable non-volatile semiconductor memory device according to claim 11, further comprising input means including at least two input terminals to which input signals are externally applied so that said data signal is determined by a combination of the input signals applied to said at least two input terminals.

13. An electrically erasable non-volatile semiconductor memory device according to claim 11, wherein each of said memory cells includes a transistor having a floating gate.

14. An electrically erasable non-volatile semiconductor memory device according to claim 11, wherein said data is written into said selected memory cell by a Fowler-Nordheim tunneling current.

15. An electrically erasable non-volatile semiconductor memory device according to claim 11, wherein said plurality of memory cells include a plurality of reference memory cells which are used for comparison of the data read out of said selected memory cell.

16. An electrically erasable non-volatile semiconductor memory device comprising:

a plurality of row lines and column lines;

a plurality of electrically erasable memory cells connected in a matrix to said plurality of row lines and column lines, each memory cell being settable at at least four different threshold values;

a plurality of address input terminals;

a plurality of address buffer circuits connected to said address input terminals, respectively, for receiving address signals through said input terminals;

a plurality of control terminals;

decoder means for selecting one of said row lines and one of said column lines based on outputs of said address buffer circuits, thereby selecting one of said plurality of memory cells;

data input buffer means for receiving a data signals to be written into said memory cells;

data output buffer means for outputting a data signal written in said selected one memory cell;

a program circuit for producing at least four different voltage signals corresponding to said at least four different threshold values, selecting one of said at least four different voltage signals based on an output of said data input buffer means and setting said selected one memory cell at one of said threshold values corresponding to said selected voltage signal, thereby writing the data signal into said selected memory cell; and a sense circuit for detecting the threshold value of said selected memory cell as an electrical signal from said selected column line, converting said threshold value into a corresponding data signal and outputting said converted data signal to said data output buffer means.

17. An electrically erasable non-volatile semiconductor memory device according to claim 16, wherein each of said memory cells includes a transistor having a floating gate and said data signal is written in said selected memory cell by a Fowler-Nordheim tunneling current through said selected column line.

18. An electrically erasable non-volatile semiconductor memory device according to claim 16, wherein said plurality of memory cells include a plurality of reference memory cells.

19. An electrically erasable non-volatile semiconductor memory device according to claim 18, wherein said reference memory cells are set to said at least four different threshold values, respectively.

20. An electrically erasable non-volatile semiconductor memory device according to claim 16, wherein said sense circuit includes a plurality of reference memory cells.

21. An electrically erasable non-volatile semiconductor memory device according to claim 20, wherein said reference memory cells are set to said at least four different threshold values, respectively.

* * * * *